United States Patent [19]
Tung et al.

[11] Patent Number: 5,500,387
[45] Date of Patent: Mar. 19, 1996

[54] METHOD OF MAKING HIGH PERFORMANCE CAPACITORS AND/OR RESISTORS FOR INTEGRATED CIRCUITS

[75] Inventors: Yingsheng Tung, Plano; Robert E. Dixon, Garland; Shih-Hsin Ying, Plano, all of Tex.

[73] Assignee: Texas Instruments Incorporated, Dallas, Tex.

[21] Appl. No.: 197,439

[22] Filed: Feb. 16, 1994

[51] Int. Cl.$^6$ .............................................. H01L 21/8242
[52] U.S. Cl. ............................ 437/60; 437/918; 437/919
[58] Field of Search .............................. 437/60, 918, 919, 437/59

[56] References Cited

U.S. PATENT DOCUMENTS

| | | | |
|---|---|---|---|
| 4,367,580 | 1/1983 | Guterman. | |
| 4,502,894 | 3/1985 | Seto et al.. | |
| 4,898,838 | 2/1990 | Morris et al. | 437/31 |
| 5,025,741 | 6/1991 | Suwanai et al. | 437/52 |
| 5,198,386 | 3/1993 | Gonzalez | 437/52 |

FOREIGN PATENT DOCUMENTS 4-299564A 10/1992 Japan ...................... 437/918

*Primary Examiner*—George Fourson
*Assistant Examiner*—Richard A. Booth
*Attorney, Agent, or Firm*—Paul C. Hashim; W. James Brady; Richard L. Donaldson

[57] ABSTRACT

A method of making an integrated circuit containing a capacitor comprising the steps of providing a semiconductor substrate having an active region and an oxide region on the substrate defining the active region, forming a mask on the active region, forming a region of heavily doped polysilicon on the oxide region having a doping level of from about 10 to about 15 ohms/square, removing the mask from the active region, commencing fabrication of an active device in the active region, forming a layer of electrically insulating material over the region of heavily doped polysilicon and a layer of electrically insulating material over the active region, forming a layer of heavily doped polysilicon having a doping level of from about 10 to about 15 ohms/square on the electrically insulating material to complete fabrication of the capacitor and on the active region and completing fabrication of an active device in the active region. More than one capacitor can be formed, this being accomplished by concurrently duplication of the above described process of forming a capacitor on another region of the substrate. The capacitors can have different capacitance by enlarging the insulating layer thereof, this being accomplished either by removal of oxide from or addition of oxide to one of the capacitors to the exclusion of the other during processing.

9 Claims, 2 Drawing Sheets

METHOD OF MAKING HIGH PERFORMANCE CAPACITORS AND/OR RESISTORS FOR INTEGRATED CIRCUITS

CROSS REFERENCE TO RELATED APPLICATION

This application is related to Ser. No. 08/197,438, filed Feb. 16, 1994, now abandoned, for PROCESS FOR MANUFACTURING INTEGRATED CIRCUIT CAPACITORS AND RESISTORS AND THE CAPACITORS AND RESISTORS, the contents of which are incorporated herein by reference.

BACKGROUND OF THE INVENTION

1. Field of the Invention

This invention relates to a method of manufacturing high performance integrated circuit capacitors and/or resistors and the resulting capacitors and/or resistors.

2. Brief Description of the Prior Art

Integrated circuit capacitors, which are generally any two layers of electrical conductor with a dielectric therebetween, are generally disposed either (1) over active devices in the active device or moat regions of the entire integrated circuit, in which case the capacitors can be separate components or share structure with active components or (2) separated from the active device or moat region in which case such capacitors are generally disposed over the field oxide separating the active device or moat regions.

Integrated circuit capacitors as presently provided generally include either a portion of substrate silicon which has been highly doped or a highly doped polycrystalline silicon (polysilicon) layer with a dielectric thereover with the upper capacitor plate formed of metal, such as part of the metal interconnect or a thin (about 2K to 3K Å) polysilicon film forming the upper plate. Such thin film polysilicon capacitor plates are difficult to dope to high dopant concentration and thus are not highly electrically conductive. The polysilicon films of such prior art capacitors are generally doped by ion implant or with phosphorous, generally $POCl_3$. Consequently, the voltage coefficient of such capacitors tends to be poor in that the capacitor cannot hold its value when the bias thereacross changes due to the formation of space charge regions with the polysilicon. Also, when a low quality dielectric is used, the frequency performance is degraded. This limits the performance of the circuits that employ such capacitors as circuit elements.

High performance circuits which require linearity in the range of about 14 bits and higher generally require a precision capacitor. Such capacitors are of much higher quality than those generally fabricated in state of the art integrated circuits by the standard state of the art techniques.

It is therefore apparent that the quality of the capacitor plates and dielectric must be improved. To provide such improved capacitor plates in semiconductor material, it is necessary that the semiconductor material be very highly doped. However, a problem that arises is that the temperatures and duration required to provide the desired degree of doping in the present processing techniques disrupts the "thermal budget" (the time and temperature constraints which the circuit being fabricated can withstand without changing the electrical parameters of the circuit). It is therefore apparent that new processing techniques are required to provide capacitors of the quality required for the next generation of devices.

SUMMARY OF THE INVENTION

In accordance with the present invention, the above noted problem is minimized by fabrication of the bottom plate of the capacitor before the gate threshold voltage ($v_t$) implant and gate oxidation steps are performed whereas the polysilicon deposition and doping of the top plate of the capacitor are each provided concurrently with the same steps for fabrication of the gate electrode. In addition, the bottom and/or top plate can be fabricated as a resistor alone or as the combination of a capacitor plate and a resistor.

Briefly, there is provided a semiconductor substrate having a field oxide and one or more masked (preferably nitride masked) active or moat regions wherein, initially, before doping, a first polysilicon layer is deposited over the substrate surface and heavily doped to provide the region from which the bottom plate of the capacitor will be formed. This bottom plate region is preferably disposed over the field oxide. The doped first polysilicon layer is then patterned and etched to provide the highly doped regions which will form the bottom plate of the capacitor. Alternatively, the bottom plate can be doped and shaped to provide a resistor of predetermined resistance, based upon the shape and doping level of the first polysilicon layer in place of or in conjunction with its function as a capacitor plate. The mask over the moat region is then removed and a new oxide layer is formed over the moat region and over the highly doped first polysilicon regions. A $V_t$ implant is now performed to set the device operating limits and the oxide layer is then removed from the moat region and selected portions of the highly doped first polysilicon regions.

It should be understood that the plural highly doped first polysilicon regions could be treated alike and/or one polysilicon region could be eliminated. The reason for the different treatment herein is to show how capacitors can be concurrently fabricated and still have different capacitance values. The differences in capacitance values are due to the difference in dielectric thickness which will result from the process depicted herein. This different treatment applies to the manner in which resistors can be concurrently fabricated and still have different resistance values, this also being due to the geometry and doping level of the regions of first polysilicon.

A further thermal oxidation now takes place to thicken the oxide layer already existing on one of the first doped polysilicon regions and to form a thinner oxide layer or other doped polysilicon regions.

A layer of second polysilicon is then deposited over the entire substrate, doped, patterned and etched to concurrently provide the top capacitor plate for each of the capacitors as well as the gate electrode for a transistor being fabricated in the moat region. Appropriate metallization and other standard processing steps will now take place to complete the integrated circuit with capacitor(s).

Alternately, the second polysilicon layer can be utilized as a resistor by appropriate doping and/or patterning thereof or the second polysilicon layer can be utilized as both a resistor as well as the top capacitor plate as above described.

The second polysilicon layer can be metallized to provide improved conductance thereto. This is accomplished by initially depositing and patterning the polysilicon layer, which remains undoped, over the oxide layer. The metal in contact with the polysilicon forms a metal silicide therewith and the unreacted metal, which is disposed over the oxide layer and does not contact the polysilicon, is then removed in standard manner.

In any of the cases as demonstrated above, wherein the top and bottom plates operate as capacitor plates, resistors or a combination of resistors and capacitor plates, appropriate metallization is then provided to connect the capacitors and/or resistors to devices either in the moat surrounded by the field oxide on which the resistors and/or capacitors are disposed and/or external to the moat region.

DESCRIPTION OF THE PREFERRED EMBODIMENT

Figure 1A:
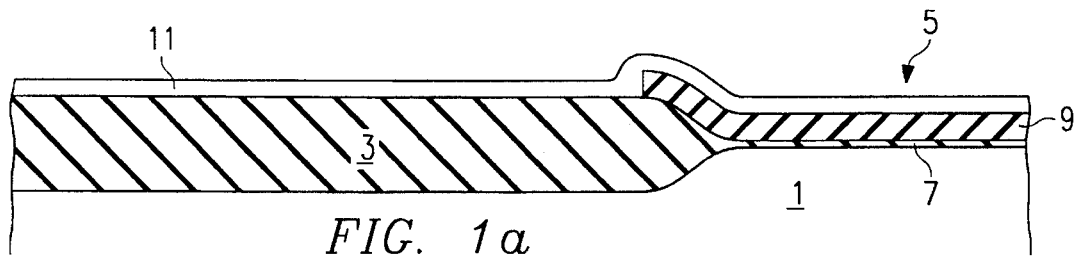
FIGS. 1a to 1i are a process flow in accordance with the present invention.

With reference to FIG. 1a, for fabrication of a capacitor or capacitors, there is initially provided a semiconductor substrate 1, preferably silicon, on which is grown a field oxide 3 defining active areas or moats 5 whereat active and/or passive semiconductor elements are generally disposed. A thin dummy gate oxide region 7 extends from the field oxide 3 over the moat 5. A layer of silicon nitride 9 having a thickness of about 1.4K Å is deposited over the moat 5 and extends onto the field oxide 3 to act as a mask for the moat region during the field oxidation process. A 4.5K Å layer of first polysilicon 11 is then deposited over the entire exposed surface of the substrate 1 and doped to provide a sheet resistance of about 14 ohms/square for use as a capacitor plate.

Figure 1B:
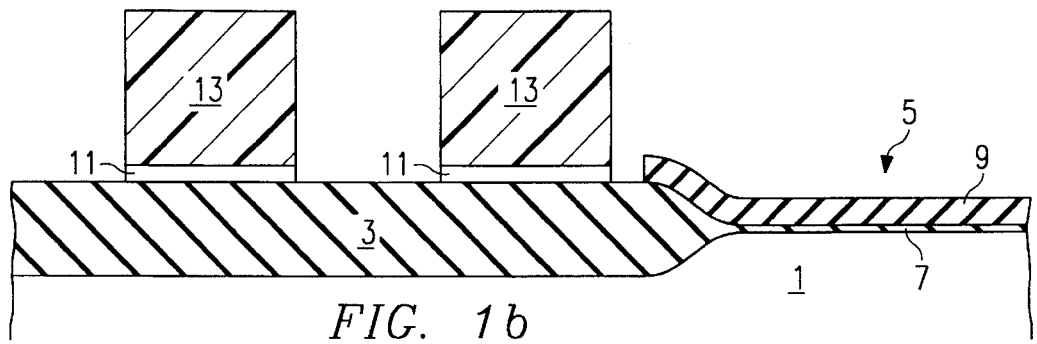
Figure 1C:
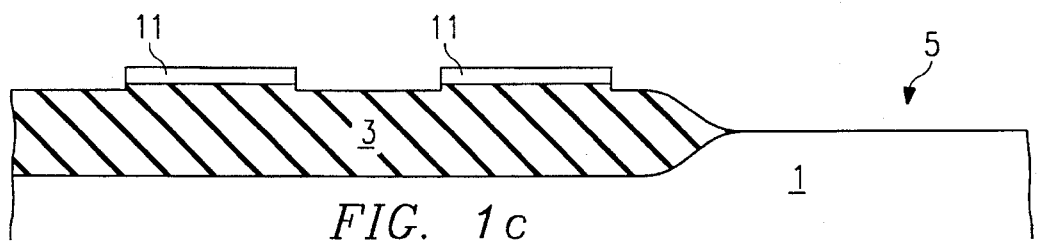
Figure 1D:
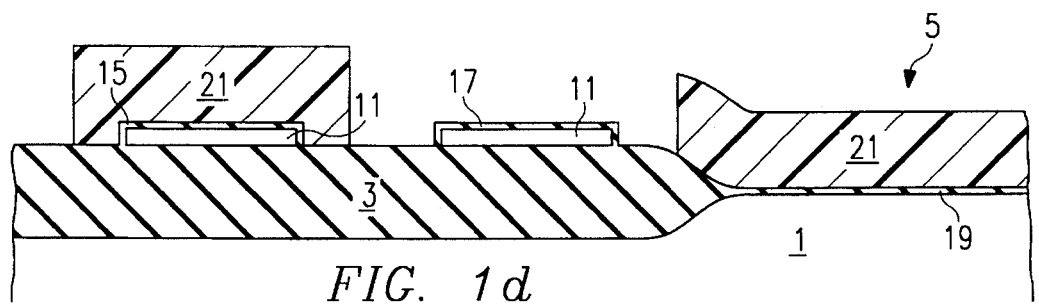
Figure 1E:
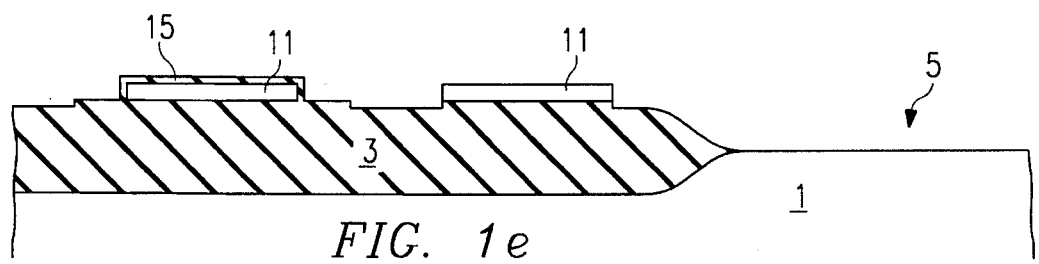

The doped polysilicon layer 11 is then patterned with photoresist 13 and etched to remove all of the doped polysilicon except for two regions 11 over the field oxide 3 as shown in FIG. 1b. The photoresist 13 is then removed and a blanket oxide (not shown) is formed over the entire surface by any standard method. The blanket oxide is patterned and etched in standard manner so that the blanket oxide remains only over the polysilicon regions 11. The remaining nitride layer 9 is then removed in standard manner and the dummy gate oxide layer 7 over the moat region is then etched away in standard manner as shown in FIG. 1c. The exposed silicon regions 11 are then thermally oxidized to provide oxide layers 15 and 17 over the polysilicon regions 11 and an oxide layer 19 over the moat 5. A resist 21 is then placed over the oxide region 15 and the moat 5 as shown in FIG. 1d and the remaining dummy oxide 17 is removed. The mask is then removed, the oxide 15 is masked and the dummy gate oxide 19 is removed from the moat region 5, the latter mask also then being removed as shown in FIG. 1e.

Figure 1F:
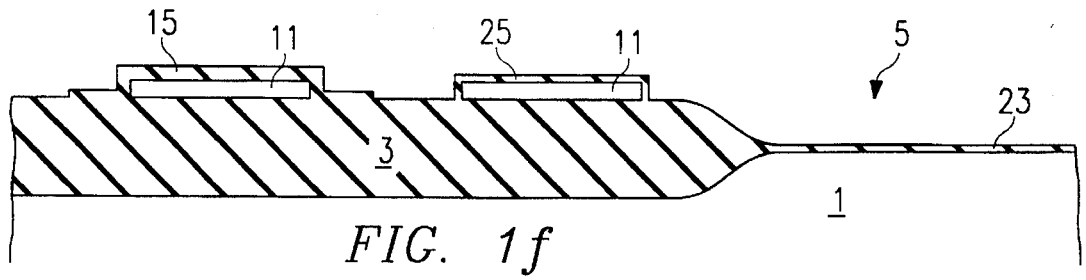
Figure 1G:
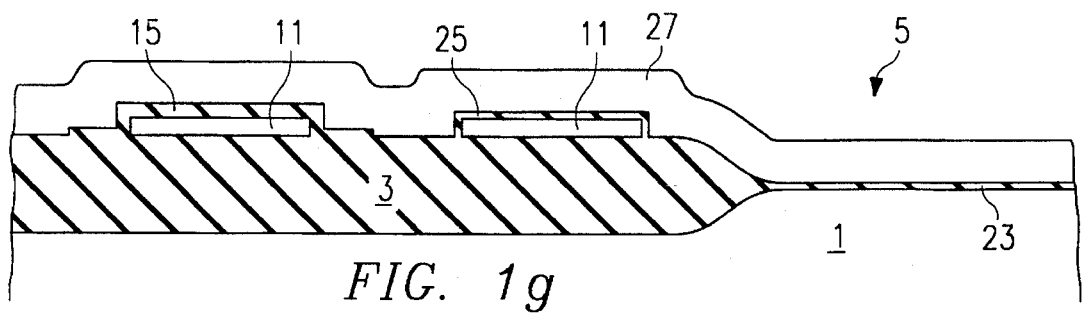
Figure 1H:
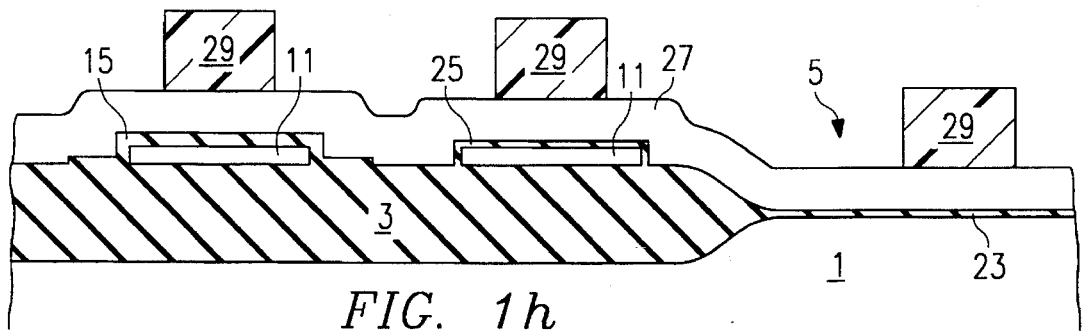
Figure 1I:
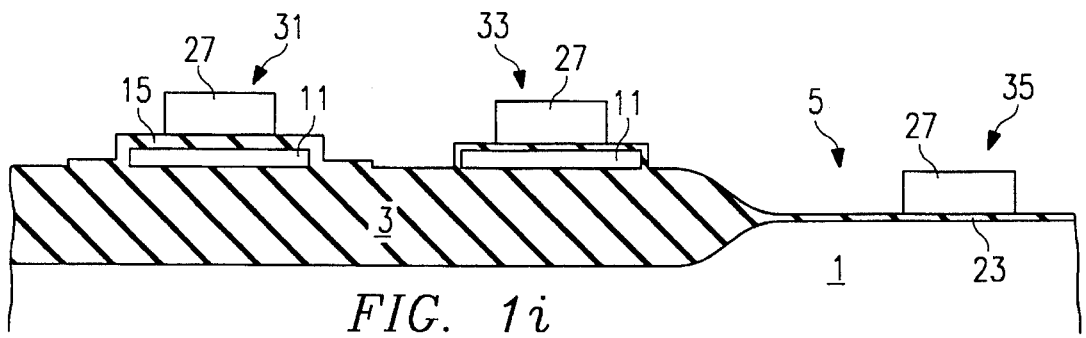

A thermal oxide is then formed, providing an oxide layer 23 over the moat region 5, an oxide layer 25 over one of the polysilicon regions 11 and an expansion of the oxide layer 15 over the other polysilicon region 11 as shown in FIG. 1f. A 4.5K Å layer of second polysilicon 27 is then deposited over the surface of the wafer and then heavily doped with $POCl_3$ from about 10 ohms/square to about 15 ohms/square and preferably 14 ohms/square as shown in FIG. 1g. The polysilicon layer 27 is then patterned with a resist 29 as shown in FIG. 1h and the exposed polysilicon is etched away as shown in FIG. 1i to provide a low capacitance capacitor 31, a high capacitance capacitor 33 and a transistor 35 having a gate 27 over the oxide 23. Appropriate metallization (not shown) (e.g. source/drain formation) and other standard processing steps (not shown) will now take place to complete the integrated circuit with capacitor(s).

While two capacitors have been described in connection with the preferred embodiment, this has been done for the purpose of demonstrating how two capacitors having different capacitance values can be concurrently fabricated. The invention applies equally well to the formation of only one of the capacitors to the exclusion of the other.

It can be seen that a capacitor is fabricated wherein the bottom plate of the capacitor has been highly doped before processing of the other components takes place as shown in FIG. 1a and wherein the doping of the top plate of the capacitor takes place in conjunction with the doping of the gate of the transistor as shown in FIG. 1g. Accordingly, there is provided a process which is compatible with the common CMOS fabrication process with the additional processing required to form the capacitor being minimal. The additional processing is performed before the formation of the transistor so that it does not tax the total thermal budget. The bottom plate can be doped heavily to achieve low voltage coefficient without degrading transistors because it is formed prior to transistor fabrication. Also, plural capacitors with more than one specific capacitance can be achieved as is evident from the two capacitors formed in FIG. 1i.

With reference to FIG. 1i, the top capacitor plates 27 and/or the bottom capacitor plates 11 can also operate as resistors rather than capacitors and/or as capacitor plates as described hereinabove as well as simultaneously acting as resistors. Referring again to FIG. 1a, for fabrication of resistors and/or capacitors, there is initially provided a semiconductor substrate 1, preferably silicon, on which is grown a field oxide 3 defining active areas or moats 5 whereat active and/or passive semiconductor elements are generally disposed. A thin dummy gate oxide region 7 which extends from the field oxide 3 extends over the moat 5. A layer of silicon nitride 9 having a thickness of about 1.4K Å is deposited over the moat 5 and extends onto the field oxide 3 to act as a mask for the moat region during the field oxidation process. A 4.5K Å layer of first polysilicon 11 is then deposited over the entire exposed surface of the substrate 1 and doped to an appropriate level commensurate with the geometry of sections thereof as discussed hereinabove to provide a desired resistivity.

The doped polysilicon layer 11 is then patterned with photoresist 13 and etched to remove all of the doped polysilicon except for two patterned regions 11 over the field oxide 3 as shown in FIG. 1b. The photoresist 13, dummy gate oxide layer 7 and silicon nitride layer 9 are then etched away in standard manner as shown in FIG. 1c. The exposed silicon regions are then thermally oxidized to provide oxide layers 15 and 17 over the polysilicon regions 11 and an oxide layer 19 over the moat 5.

A resist 21 is then placed over the oxide region 15 as shown in FIG. 1d and the remaining dummy oxide 17 and 19 is removed as shown in FIG. 1e. A thermal oxide is then formed, providing an oxide layer 23 over the moat region 5, an oxide layer 25 over one of the polysilicon regions 11 and an expansion of the oxide layer 15 over the other polysilicon region 11 as shown in FIG. 1f. The steps of using resist 21 over the oxide region 15 as shown in FIG. 1d, removing the remaining dummy oxide 17 and 19 as shown in FIG. 1e, forming a thermal oxide to provide an oxide layer 23 over the moat region 5, an oxide layer 25 over one of the polysilicon regions 11 and an expansion of the oxide layer 15 over the other polysilicon region 11 as shown in FIG. 1f can be omitted if capacitors having two different capacitances is not required. In this case, the thermal oxide layers 15 and 25 of FIG. 1f would be of the same thickness.

A 4.5K Å layer of second polysilicon 27 is then deposited over the surface of the wafer and then heavily doped with $POCl_3$ to a level in accordance with the final geometry of the later patterned second polysilicon to provide a predetermined resistance value as shown in FIG. 1g. The polysilicon layer 27 is then patterned with a resist 29 as shown in FIG. 1h and the exposed polysilicon is etched away as shown in FIG. 1i to provide either a low capacitance capacitor 31 and/or a high capacitance capacitor 33 and/or resistors at layer 11 and/or resistors at layer 27 and a transistor 35 having a gate 27 over the oxide 23. Appropriate metallization (not shown) (e.g. source/drain formation) and other standard processing steps (not shown) will now take place to complete the integrated circuit with capacitor(s) and/or resistor(s).

While two resistors and/or capacitors have been described in connection with this embodiment, this has been done for the purpose of demonstrating how two resistors and/or capacitors with the capacitors having different capacitance values can be concurrently fabricated. The invention applies equally well to the formation of only one of the capacitors to the exclusion of the other or to one or more capacitors with one or both of the capacitor plates also acting as a resistor or to one or more of the capacitor plates acting as a resistor with little or no capacitive action taking place.

It can be seen that a resistor and/or capacitor is fabricated wherein the bottom plate of the capacitor has been highly doped before processing of the other components takes place as shown in FIG. 1a and wherein the doping of the top plate of the capacitor and/or resistor takes place in conjunction with the doping of the gate of the transistor as shown in FIG. 1g. Accordingly, there is provided a process which is compatible with the common CMOS fabrication process with the additional processing required to form the capacitor and/or resistor being minimal. The additional processing is performed before the formation of the transistor so that it does not tax the thermal budget after gate formation. The bottom plate can be doped heavily to achieve low voltage coefficient without degrading transistors because it is formed prior to transistor fabrication. Also, plural capacitors with more than one specific capacitance can be achieved as is evident from the two capacitors formed in FIG. 1i.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of making an integrated circuit comprising the steps of:
   (a) providing a semiconductor substrate having a masked active surface region and an inactive surface region defining said active region;
   (b) forming a first layer of doped polysilicon on said inactive region;
   (c) patterning and etching said first layer;
   (d) removing the mask from said masked active region;
   (e) forming a layer of electrically insulating material over said first layer of doped polysilicon;
   (f) forming a second layer of heavily doped polysilicon having a sheet resistance of from about 10 ohms/square to about 15 ohms/square on said electrically insulating material;
   (g) forming a first capacitor from said first layer and said second layer by forming contacts on said first layer and on said second layer; and
   (h) forming a second capacitor having a capacitance different from that of said first capacitor by the steps of forming said first layer of doped polysilicon on two spaced apart portions of said inactive region, removing said layer of electrically insulating material over said first layer of doped polysilicon from one of said two spaced apart portions of said inactive region, forming a second layer of electrically insulating material over said two spaced apart portions of said inactive region so that the layer of electrically insulating material over one of said two spaced apart portions is now thicker than the layer of electrically insulating material over the other of said two spaced apart portions and then forming said second layer of heavily doped polysilicon on said electrically insulating material.

2. The method of claim 1 further including the step of forming said second capacitor at the other of said two spaced apart portions by forming contacts on said first layer of said other of said two spaced apart portions and on the portion of said second layer disposed over said other of said two spaced apart portions of said first layer.

3. A method of making an integrated circuit comprising the steps of:
   (a) providing a semiconductor substrate having a masked active surface region and an inactive surface region defining said active region;
   (b) forming a first layer of doped polysilicon on said inactive region;
   (c) patterning and etching said first layer;
   (d) removing the mask from said masked active region;
   (e) forming a layer of electrically insulating material over said first layer of doped polysilicon;
   (f) forming a second layer of heavily doped polysilicon having a sheet resistance of from about 10 ohms/square to about 15 ohms/square on said electrically insulating material;
   (g) forming a resistor in said first layer by forming contacts at opposing ends of said first layer;
   (h) forming a first capacitor from said first layer and said second layer by forming contacts on said first layer and on said second layer; and
   (i) forming a second capacitor having a capacitance different from that of said first capacitor by the steps of forming said first layer of doped polysilicon on two spaced apart portions of said inactive region, removing said layer of electrically insulating material over said first layer of doped polysilicon from one of said two spaced apart portions of said inactive region, forming a second layer of electrically insulating material over said two spaced apart portions of said inactive region so that the layer of electrically insulating material over one of said two spaced apart portions is now thicker than the layer of electrically insulating material over the other of said two spaced apart portions and then forming said second layer of doped polysilicon on said electrically insulating material.

4. The method of claim 3 further including the step of forming said second capacitor at the other of said two spaced apart portions by forming contacts on said first layer of said other of said two spaced apart portions and on the portion of said second layer disposed over said other of said two spaced apart portions of said first layer.

5. A method of making an integrated circuit comprising the steps of:
   (a) providing a semiconductor substrate having a masked active surface region and an inactive surface region defining said active region;

(b) forming a first layer of doped polysilicon on said inactive region;

(c) patterning and etching said first layer;

(d) removing the mask from said masked active region;

(e) forming a layer of electrically insulating material over said first layer of doped polysilicon;

(f) forming a second layer of doped polysilicon having a sheet resistance of from about 10 ohms/square to about 15 ohms/square on said electrically insulating material;

(g) forming a resistor in said second layer by forming contacts at opposing ends of said second layer;

(h) forming a first capacitor from said first layer and said second layer by forming contacts on said first layer and on said second layer; and (i) forming a second capacitor having a capacitance different from that of said first capacitor by the steps of forming said first layer of doped polysilicon on two spaced apart portions of said inactive region, removing said layer of electrically insulating material over said first layer of doped polysilicon from one of said two spaced apart portions of said inactive region, forming a second layer of electrically insulating material over said two spaced apart portions of said inactive region so that the layer of electrically insulating material over one of said two spaced apart portions is now thicker than the layer of electrically insulating material over the other of said two spaced apart portions; and then forming said second layer of heavily doped polysilicon on said electrically insulating material.

6. The method of claim 5 further including the step of forming said second capacitor at the other of said two spaced apart portions by forming contacts on said first layer of said other of said two spaced apart portions and on the portion of said second layer disposed over said other of said two spaced apart portions of said first layer.

7. A method of making an integrated circuit comprising the steps of:

(a) providing a semiconductor substrate having a masked active surface region and an inactive surface region defining said active region;

(b) forming a first layer of doped polysilicon on said inactive region;

(c) patterning and etching said first layer;

(d) removing the mask from said masked active region;

(e) forming a layer of electrically insulating material over said first layer of doped polysilicon;

(f) forming a second layer of doped polysilicon having a sheet resistance of from about 10 ohms/square to about 15 ohms/square on said electrically insulating material;

(g) forming a resistor in said first layer by forming contacts at opposing ends of said first layer;

(h) forming a resistor in said second layer by forming contacts at opposing ends of said second layer;

(i) forming a first capacitor from said first layer and said second layer by forming contacts on said first layer and on said second layer; and (j) forming a second capacitor having a capacitance different from that of said first capacitor by the steps of forming said first layer of doped polysilicon on two spaced apart portions of said inactive region, removing said layer of electrically insulating material over said first layer of doped polysilicon from one of said two spaced apart portions of said inactive region, forming a second layer of electrically insulating material over said two spaced apart portions of said inactive region so that the layer of electrically insulating material over one of said two spaced apart portions is now thicker than the layer of electrically insulating material over the other of said two spaced apart portions and then forming said second layer of heavily doped polysilicon on said electrically insulating material.

8. The method of claim 7 further including the step of forming said second capacitor at the other of said two spaced apart portions by forming contacts on said first layer of said other of said two spaced apart portions and on the portion of said second layer disposed over said other of said two spaced apart portions of said first layer.

9. The method of claim 8 further including the step of forming a transistor in said active region by the steps of forming a layer of electrically insulating material over said substrate in said active region and forming a doped region of said doped polysilicon in said active region over said layer of electrically insulating material concurrently with said second layer.

* * * * *